United States Patent
Liu et al.

(10) Patent No.: US 9,862,884 B2
(45) Date of Patent: Jan. 9, 2018

(54) RED PHOSPHOR, WHITE LIGHT SOURCE, LIGHT EMITTING DEVICE, AND METHOD FOR FORMING THE RED PHOSPHOR

(71) Applicant: OSRAM GmbH, Munich (DE)

(72) Inventors: Zhong Shi Liu, Shanghai (CN); Wenhui Zhao, Beijing (CN); Xiping Jing, Beijing (CN)

(73) Assignee: OSRAM GmbH, München (DE)

( * ) Notice: Subject to any disclaimer, the term of this patent is extended or adjusted under 35 U.S.C. 154(b) by 0 days.

(21) Appl. No.: 14/899,520

(22) PCT Filed: May 19, 2014

(86) PCT No.: PCT/EP2014/060269
§ 371 (c)(1),
(2) Date: Dec. 17, 2015

(87) PCT Pub. No.: WO2014/202311
PCT Pub. Date: Dec. 24, 2014

(65) Prior Publication Data
US 2016/0137917 A1    May 19, 2016

(30) Foreign Application Priority Data
Jun. 17, 2013 (CN) .......................... 2013 1 0240049

(51) Int. Cl.
*C09K 11/64* (2006.01)
*H01L 33/50* (2010.01)

(52) U.S. Cl.
CPC .......... *C09K 11/643* (2013.01); *H01L 33/502* (2013.01); *Y02B 20/181* (2013.01)

(58) Field of Classification Search
CPC ....... C09K 11/64; C09K 11/57; H01L 33/502; H01L 33/504
See application file for complete search history.

(56) References Cited

U.S. PATENT DOCUMENTS

| | | |
|---|---|---|
| 7,329,371 B2 | 2/2008 | Setlur et al. |
| 7,846,350 B2 | 12/2010 | Chen et al. |
| 8,274,215 B2 | 9/2012 | Liu et al. |
| 2006/0169998 A1 | 8/2006 | Radkov et al. |

FOREIGN PATENT DOCUMENTS

| | | | |
|---|---|---|---|
| CN | 102286281 | * | 12/2011 |
| CN | 102286281 A | | 12/2011 |
| CN | 102732250 | * | 10/2012 |
| EP | 1073089 A1 | | 1/2001 |
| JP | 2004235546 A | | 8/2004 |
| WO | 2006072919 A2 | | 7/2006 |

OTHER PUBLICATIONS

Peng et al, "Orderly-Layered Tetravalent Magnese_doped Strontium Aluminate Sr4Al14O25:Mn4+: An Effective Red Phoshor for Warn White Light Emitting Diodes", J. Am Ceram. Soc., 96[9}, pp. 2870-2876, Sep. 1, 2013.*
Translation for CN 102732250, Oct. 2012.*

* cited by examiner

*Primary Examiner* — Carol M Koslow
(74) *Attorney, Agent, or Firm* — Slater Matsil, LLP

(57) ABSTRACT

The present invention relates to a red phosphor, which includes an element A, magnesium, aluminum, oxygen, and manganese in Chemical Formula (1) that is $(A_{1-x}Mg_x)_4Al_{14-y}O_{25}:\gamma Mn^{4+}$. The element A in the Chemical Formula (1) is at least one of strontium, barium, and calcium, and x and y in the Chemical Formula (1) satisfy the relational expressions $0<=x<1$ and $0<y<1$.

11 Claims, 2 Drawing Sheets

RED PHOSPHOR, WHITE LIGHT SOURCE, LIGHT EMITTING DEVICE, AND METHOD FOR FORMING THE RED PHOSPHOR

This patent application is a national phase filing under section 371 of PCT/EP2014/060269, filed May 19, 2014, which claims the priority of Chinese patent application 201310240049.X, filed Jun. 17, 2013, each of which is incorporated herein by reference in its entirety.

TECHNICAL FIELD

The present invention relates to a red phosphor and a method for forming the same, and further relates to a white light source and a light emitting device.

BACKGROUND

In recent years, lighting technology is rapidly developed, particularly lighting devices adopting the technology of light emitting diodes (LED). Lighting devices provided with LEDs have numerous advantages, such as energy saving, long lifetime, and color control etc., which advantages are much more significant, particularly compared with traditional incandescent lamps and discharge light sources. In order to realize white light utilizing LED technology, a blue LED chip can generally be used in combination with a yellow phosphor and red phosphor or a green phosphor and a red phosphor, so as to mix light to form white light. In order to realize the application of LED technology, the obtainment of a red phosphor used to form white light becomes a key topic.

A technical solution is provided according to the prior art, see, U.S. Pat. No. 7,846,350 B2, which discloses a group of red-emitting phosphors. And the phosphor group consists of $Mg_{14}(Ge_{(5-a)}Mn_a)O_{24}$, $Sr(Ge_{(4-b)}Mn_b)O_9Mg_2(Ti_{(1-c)}Mn_c)O_4$ etc. In addition, different maximum emission peaks can be realized through the phosphors when being respectively excited by light sources having different wavelengths, e.g., in the system $Zn_2(Ti_{(1-d)}Mn_d)O_4$, such a phosphor can have an emission peak located at 675 nm under excitation of a light source located at 362 nm. However, These phosphors can not be excited by blue light, especially the blue light at 460-470 nm, and the emission peak locates in the deep red range which is not the most sensitive range to human eyes.

Additionally, with reference to U.S. Patent Publication No. 2006/0169998 A1, it discloses a red phosphor family, which is doped with a tetravalent manganese ion $Mn^{4+}$, and would have an emission peak located between 600 nm and 642 nm under excitation of a light source having a wavelength between 450 nm and 470 nm. Although the technical solutions can achieve the effect of emitting red light, the stability of the phosphor in a high temperature environment is poor, e.g., the phosphor would decompose at 200° C., and HF acid that is highly toxic is required in the synthesis, which restrains the application of the LED having the phosphor.

In another technical solution of the prior art, an oxynitride red phosphor is provided, and is applied to LED lighting technology. U.S. Pat. No. 8,274,215 B2 discloses a red-emitting phosphor based on $CaAlSiN_3$ type compounds that are activated by $Eu^{2+}$, and a phosphor of such a type can be excited by blue light and have an emission peak located at 630 nm or 640 nm. In spite of this, the raw materials required by the phosphor and the synthesis process of the nitride compounds require high costs, and a high temperature and high pressure environment is necessary for forming the phosphor.

In addition, U.S. Pat. No. 7,329,371 B2 discloses an oxide phosphor, which can be excited by a light source having a wavelength between 350 nm and 430 nm, and emit red light. However, the phosphor of such a type cannot be excited by a blue light source, and therefore cannot be applied to blue light sources.

SUMMARY

In order to solve the above technical problems, the present invention provides a novel red phosphor. Such a red phosphor has the advantage of environmental protection because the use of rear earth elements or heavy metal elements is avoided, and the raw materials for manufacturing the phosphor require low cost, the process of synthesizing the phosphor is also simple, and consequently, no complex instrument is necessary. Moreover, the phosphor can improve the color temperature of the white light emitted through LED lighting, enhance illumination intensity, and achieves hereby the requirements of R9 of color rendering index (CRI). In addition, the red phosphor can also be excited by blue light or ultraviolet light to produce red light, without absorbing green or yellow light.

According to the present invention, the red phosphor comprises an element A, magnesium (Mg), aluminum (Al), oxygen (O), and manganese (Mn) in Chemical Formula (1) that is $(A_{1-x}Mg_x)_4Al_{14-y}O_{25}:yMn^{4+}$, wherein the element A in the Chemical Formula (1) is at least one of strontium (Sr), barium (Ba), and calcium (Ca), and x and y in the Chemical Formula (1) satisfy the relational expressions $0<x<1$ and $0<y<1$. The red phosphor provides the possibility of being excited by a blue light source, and the use of rear earth elements or heavy metal elements is avoided.

According to the present invention, it is provided that $0<x<1$ and $0<y<1$ in Chemical Formula (1). Mg is introduced in the red phosphor and provides the possibility of enhancing luminous intensity.

According to the present invention, the red phosphor has an emission peak with wavelength between 635 nm and 675 nm. In this case, a possibility for improving the color of the emitted red light is provided so as to satisfy the requirements of R9 of CRI in a better manner. Additionally, it is preferable that the red phosphor has an emission peak with wavelength between 650 nm and 675 nm.

In a preferable embodiment according to the present invention, the red phosphor has an emission peak at 652 nm. By this feature, it is provided that the red light emitting from the phosphor would be acceptable.

Another embodiment of the present invention includes a white light source, which comprises: a blue light emitting diode; and a composition that is provided on the blue light emitting diode, which comprises a red phosphor and a yellow phosphor or a green phosphor and red phosphor, wherein the red phosphor comprises an element A, magnesium (Mg), aluminum (Al), oxygen (O), and manganese (Mn) in Chemical Formula (1) that is) $(A_{1-x}Mg_x)_4Al_{14-y}O_{25}:yMn^{4+}$, wherein the element A in the Chemical Formula (1) is at least one of strontium (Sr), barium (Ba), and calcium (Ca), and $0<x<1$ and $0<y<1$. In order to achieve proper white light, blue light source in combination with yellow phosphor and red phosphor is used, or blue light source in combination with green phosphor and red phosphor is used. The white light can be realized through excitation of corresponding phosphors by a blue light source, such that the possibility for LED technology adopting a blue light source can be realized.

According to the present invention, it is provided that $0<x<1$ and $0<y<1$ in Chemical Formula (1). Mg is introduced in the white light source and provides the possibility of enhancing luminous intensity.

Further another embodiment of the present invention includes a light emitting device, which comprises a light source emits light; and the red phosphor according to the description, which is excited by at least partial light to generate the excited light with a higher wavelength than that of the original light. In this case, in combination with a blue light emitting LED, the regulation of color temperature can be realized by coating a red phosphor and a yellow phosphor or a green phosphor and a red phosphor on the LED, and the possibility of outputting white light can be achieved.

It is preferable that the light source provides light with a wavelength between 450 nm and 470 nm. Light having the wavelength corresponds to a blue light source.

It is preferable that the light source provides light with a wavelength between 275 nm and 375 nm. Light having the wavelength corresponds to an ultraviolet light source.

It is preferable that the light source is configured as a LED. LED light sources have advantages of energy saving and long service life etc., and stability and reliability of lighting can hereby be realized.

It is preferable that the red phosphor has an emission peak with a wavelength between 635 nm and 675 nm. In this case, the possibility of improving the color of the emitted red light can be provided, so as to satisfy the requirements of R9 of CRI in a better manner.

It is preferable that the red phosphor has an emission peak at 652 nm. By this feature, it is provided that the red light emitting from the phosphor would be acceptable.

Further another object of the present invention is achieved through a method for forming a red phosphor having Chemical Formula (1) that is $(A_{1-x}Mg_x)_4Al_{14-y}O_{25}:yMn^{4+}$, wherein the element A in the Chemical Formula (1) is at least one of strontium (Sr), barium (Ba), and calcium (Ca), and $0<x<1$ and $0<y<1$; the method comprising the steps of: selecting a compound containing the element A, $Al_2O_3$, $MnO_2$, and $4MgCO_3\cdot Mg(OH)_2\cdot 4H_2O$ as raw materials, weighing the corresponding raw materials in a molar ratio according to the Chemical Formula (1) of the phosphor, and adding a flux to form a mixture; and calcining the mixture at a temperature of 1300-1600° C. for 2 to 6 hours.

According to the present invention, it is provided that $0<x<1$ and $0<y<1$ in Chemical Formula (1). Mg is introduced in the method and provides the possibility of enhancing luminous intensity.

According to the present invention, the method further comprises grinding the mixture before calcination and grinding the calcinated product. Thus, it can be ensured that the mixture is uniformly mixed and calcinated properly.

According to the present invention, the calcinated product is washed using water or hot water. In order to obtain the expected compound after calcination, water or hot water is used to wash the calcinated product so as to provide uncontaminated compound.

In a preferable embodiment according to the present invention, the flux includes at least one of magnesium fluoride and calcium fluoride. After the use of the flux, it is easy to remove the flux by washing.

In a preferable embodiment according to the present invention, the calcination temperature increases from 1300° C. to 1600° C. at a rate of 5-10° C./min. Over-intense decomposition and loose structure as a result of rapid temperature change could be averted.

BRIEF DESCRIPTION OF THE DRAWINGS

The accompanying drawings constitute a part of the present Description and are used to provide further understanding of the present invention. Such accompanying drawings illustrate the embodiments of the present invention and are used to describe the principles of the present invention together with the Description. In the accompanying drawings, the same components are represented by the same reference numbers. As shown in the drawings.

DETAILED DESCRIPTION OF ILLUSTRATIVE EMBODIMENTS

The present invention provides a novel red phosphor for LED applications; and in the invention, $(Sr_{1-x}Mg_x)_4Al_{14}O_{25}$ is selected as host, and $Mn^{4+}$ d-d energy level transition is used to realize red emission of the phosphor. Furthermore, a bivalent magnesium ion $Mg^{2+}$ is doped in the compound, whose presence can be used in the system constructed by the chemical formula $(A_{1-x}Mg_x)_4Al_{14-y}O_{25}:yMn^{4+}$ to prevent the formation of a bivalent manganese ion $Mn^{2+}$, in order to avoid formation of $Mn^{2+}$ and/or the coupling between $Mn^{4+}$ resulting in the reduction of luminous intensity, wherein the coupling between the $Mn^{4+}$ ions can also be reduced, and the luminous intensity of light emitted by the phosphor can hereby be enhanced.

Figure 1:
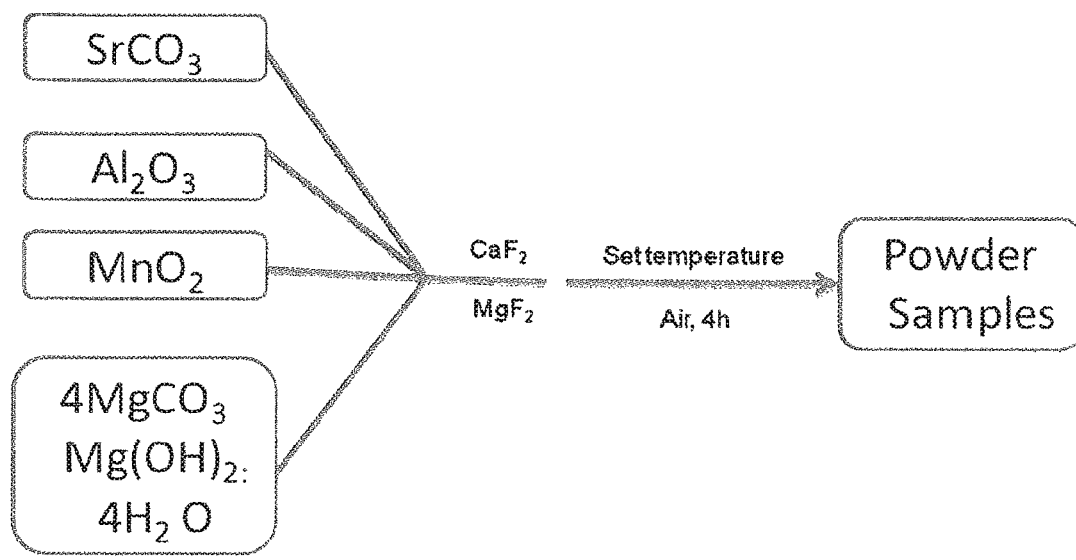
FIG. 1 is a schematic diagram showing a flow for forming a red phosphor according to an embodiment of the present invention.

FIG. 1 shows a schematic diagram for steps of forming the phosphor $(Sr_{1-x}Mg_x)_4Al_{14-y}O_{25}:yMn^{4+}$ according to an embodiment of the present invention. Such a phosphor can be synthesized by means of solid-state reaction, and such a chemical synthesis mode requires low costs. Moreover, in order to detect the phase of the compound, X-ray diffraction can be used to analyze the phase of the powder of the compound, which will be specifically described in the following contents. The performance of the phosphor can also be measured by emission spectrum and excitation spectrum. During the manufacturing process of the phosphor, a high purity reagent (purity over 99.999%) is used, which comprises, e.g., strontium carbonate $SrCO_3$, aluminum oxide $Al_2O_3$, manganese oxide $MnO_2$ and $4MgCO_3\cdot Mg(OH)_2\cdot 4H_2O$ as starting materials; for example, in order to synthesize one mole of the compound $(Sr_{1-x}Mg_x)_4Al_{14-y}O_{25}:yMn^{4+}$, the molar ratio of the required starting materials $SrCO_3$, $Al_2O_3$, $MnO_2$, and $4MgCO_3\cdot Mg(OH)_2\cdot 4H_2O$ is $$4(1-x): \left(\frac{14-y}{2}\right): (y): \left(\frac{4}{5}x\right),$$

and accordingly, when x=0.02 and y=0.02, the molar ratio of the above raw materials is 3.92:6.99:0.02:0.016, while the molar can be adjusted in accordance with specific examples. The mixture of reagents is grinded in agate mortar before calcination. During the reaction, strontium carbonate $SrCO_3$ will decompose at a high temperature so as to obtain strontium oxide SrO, and $4MgCO_3.Mg(OH)_2.4H_2O$ is also selected out of similar reasons. In order to accelerate the reaction process, a flux, e.g., magnesium fluoride $MgF_2$ and/or calcium fluoride $CaF_2$, can be selected to add into and uniformly mixed with the mixture of the raw materials. As flux, magnesium fluoride and/or calcium fluoride not only will not react with the raw materials, but also accelerates the chemical reaction; moreover, the flux can be removed after the reaction by washing with, e.g., water, so as to assure the purity of the obtained compound. When mixing the reagents and the flux, the corresponding raw materials are weighed in a molar ratio according to the requirements of the chemical formula. The obtained mixture is transferred to an $Al_2O_3$ crucible after being milled into powder, and then calcined. The desired temperature for calcination ranges from 1300° C. to 1600° C., and the temperature changes at a rate of 5-10° C./min. Moreover, the mixture is calcined for 2 to 6 hours at the temperature to assure that the chemical reaction proceeds in accordance with the predicted requirements, so as to obtain the desired compound, which is then cooled to room temperature and grinded again after the calcination.

It shall be pointed out that the whole calcination process can proceed in a normal pressure environment, in which the possibility of the use of complex instruments can be avoided so as to simplify the preparing process of the desired compound. The compound can be washed with, e.g., distilled water or hot distilled water after milling the obtained calcined compound, and the washing process can proceed repeatedly for at least three times so as to achieve the object of removing the flux and assuring the purity of the desired compound.

Figure 2:
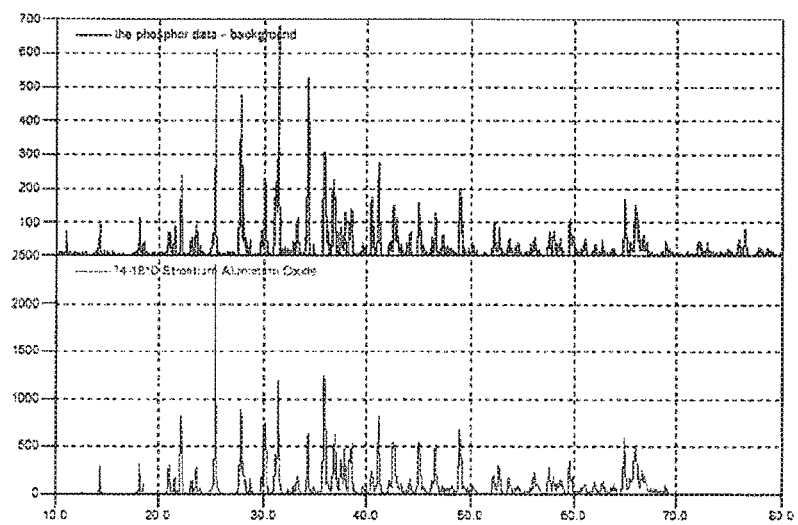
FIG. 2 is a schematic diagram showing an X-ray diffraction pattern of the red phosphor according to an embodiment of the present invention.

Moreover, FIG. 2 shows a schematic diagram of an X-ray diffraction pattern of the red phosphor according to an embodiment of the present invention. A pattern for X-ray diffraction (XRD) of the compound $(Sr_{1-x}Mg_x)_4Al_{14-y}O_{25}:yMn^{4+}$ is shown in FIG. 2, wherein x=0.02 and y=0.02. In the embodiment, the element A in the Chemical Formula (1) is configured as strontium Sr, and of course, elements such as calcium Ca or barium Ba can also be selected to replace the element strontium Sr. Moreover, a standard XRD pattern of $Sr_4Al_4O_{25}$ having a JCPDS card number of 74-1810 is also shown in the figure. Through the comparison of the XRD patterns of the two compounds, it can be observed that the desired compound can be obtained through the above described preparing method, and no peak related with the flux magnesium fluoride and/or calcium fluoride is found in the XRD patterns, which indicates that no flux residual exists in the obtained compound, and the purity of the compound is hereby assured.

Figure 3:
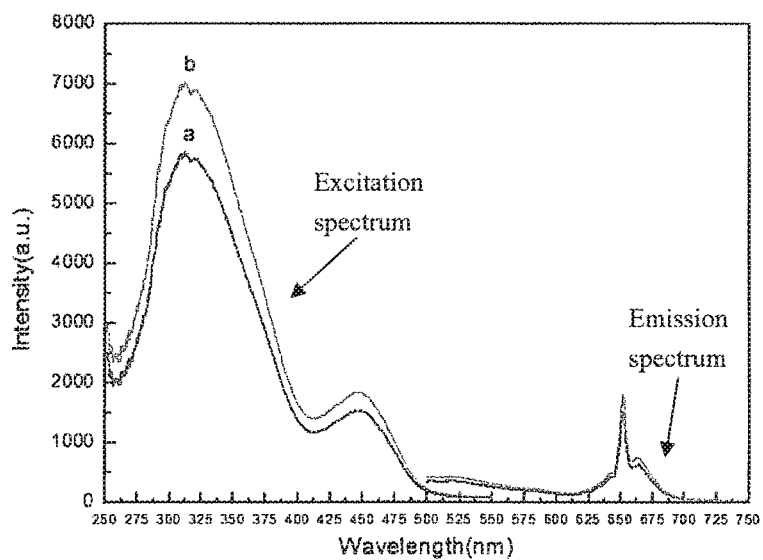
FIG. 3 shows excitation spectrum and emission spectrum of the red phosphor having Chemical Formula (1) according to two embodiments of the present invention, wherein a curve a is obtained in case of x=0 and y=0.02, and a curve b is obtained in case of x=0.02 and y=0.02.

FIG. 3 shows a schematic diagram of emission spectrum and excitation spectrum of the red phosphor $(Sr_{1-x}Mg_x)_4Al_{14-y}O_{25}:yMn^{4+}$ according to two embodiments of the present invention, wherein the curve a in the figure is obtained with x=0 and y=0.02, while the curve b in the figure is obtained with x=0.02 and y=0.02. When in the chemical formula x=0 and y=0.02, it means there is no magnesium element in the compound; while when x=0.02 and y=0.02, it means magnesium element is introduced into the compound. And it can be observed from the figure that due to the introduction of magnesium element, the corresponding spectrum curve indicates a significant improvement of luminous intensity of the emitted light obtained from the phosphor, compared with the spectrum curve corresponding to the compound without magnesium element.

Moreover, it can further be seen from the figure that there are two excitation bands in the excitation spectrum from curves a and b, wherein one center is located at 320 nm, viz. in the wavelength range of ultraviolet light, while the other center is located at 450 nm, viz. within the wavelength of blue light. Thus, it can be determined that the compound is suitable for ultraviolet LED and blue LED applications, and can be excited by the two wavelength ranges. Different compound can be obtained by varying x or y, and it can be seen that in excitation band the spectrum range from 450 nm to 470 nm and from 275 nm to 375 nm.

In addition, it can further be seen from the excitation spectrum that the phosphor of the compound does not absorb long wavelength light, e.g., yellow light or green light, wherein the light absorption almost stops as it approaching 490 nm. And the advantage lies in that, e.g., if a nitride phosphor and a YAG phosphor are simultaneously applied to a blue LED, the luminescence efficiency of the LED decreases due to absorption of the long wavelength light, e.g., yellow light, emitted by the YAG phosphor by the nitride phosphor. Accordingly, as the red phosphor according to the embodiment does not absorb the long wavelength light, e.g., yellow light, the reduction of LED luminescence efficiency due to absorption of the long wavelength light emitted by a YAG phosphor through the red phosphor can be avoided, even if the red phosphor and the YAG phosphor are simultaneously applied to a blue LED.

Additionally, it can be observed from the schematic diagram of the emission spectrum of the embodiment that the emission peak is located at 652 nm, and has two shoulder peaks respectively located at 640 nm and 660 nm. It has an emission peak with wavelength between 635 nm and 675 nm, preferably, between 650 nm and 675 nm. In addition, compared to other phosphors of $Mn^{4+}$ compounds from prior art, the emission peak of the embodiment shifts for about 4 nm, which improves R9 of CRI, so that the emitted red light is more acceptable for human eyes.

By adjusting x or y, not only excitation spectrum and emission spectrum could be adjusted, but also luminous intensity be enhanced, tables 1-4 show the different luminous intensity achieved by different x or y.

Table 1 provides values of photometric properties of the red phosphor according to the Chemical Formula (1), wherein x=0, and y ranges from 0.01 to 1, viz. the chemical formula of the compound is $Sr_4Al_{14-y}O_{25}:yMn^{4+}$, wherein the compound contains no magnesium element, and the measured values are obtained based on excitation light having a wavelength at 460 nm, viz. blue excitation light.

TABLE 1

| y (%) | relative luminous intensity (%) |
|---|---|
| 1 | 100 |
| 2 | 118 |
| 3 | 132 |
| 4 | 156 |
| 5 | 178 |
| 6 | 165 |
| 7 | 159 |
| 8 | 143 |
| 9 | 137 |
| 10 | 123 |
| 50 | 105 |
| 60 | 98 |
| 80 | 75 |
| 100 | 60 |

Table 2 provides values of photometric properties of the red phosphor according to the Chemical Formula (1), wherein y=0.05, and x ranges from 0 to 1, viz. the chemical formula of the compound is $(Sr_{1-x}Mg_x)_4Al_{13.95}O_{25}$:$0.05Mn^{4+}$, wherein the compound contains magnesium element, and the measured values are obtained based on excitation light having a wavelength at 460 nm, viz. excitation light in blue.

TABLE 2

| x (%) | relative luminous intensity (%) |
|---|---|
| 0 | 100 |
| 1 | 134 |
| 2 | 157 |
| 3 | 201 |
| 4 | 218 |
| 5 | 221 |
| 6 | 232 |
| 7 | 213 |
| 8 | 217 |
| 9 | 228 |
| 50 | 148 |
| 60 | 139 |
| 80 | 96 |
| 100 | 85 |

Table 3 provides values of photometric properties of the red phosphor according to the Chemical Formula (1), wherein x=0, and y ranges from 0.01 to 1, viz. the chemical formula of the compound is $Sr_4Al_{14-y}O_{25}$:$yMn^{4+}$, wherein the compound contains no magnesium element, and the measured values are obtained based on excitation light having a wavelength at 320 nm, viz. excitation light in ultraviolet.

TABLE 3

| y (%) | relative luminous intensity (%) |
|---|---|
| 1 | 100 |
| 2 | 232 |
| 3 | 264 |
| 4 | 312 |
| 5 | 356 |
| 6 | 330 |
| 7 | 302 |
| 8 | 284 |
| 9 | 260 |
| 10 | 234 |
| 50 | 210 |
| 60 | 187 |
| 80 | 150 |
| 100 | 80 |

Table 4 provides values of photometric properties of the red phosphor according to the Chemical Formula (1), wherein y=0.05, and x ranges from 0 to 1, viz. the chemical formula of the compound is $(Sr_{1-x}Mg_x)_4Al_{13.95}O_{25}$:$0.05Mn^{4+}$, wherein the compound contains magnesium element, and the measured values are obtained based on excitation light having a wavelength at 320 nm, viz. excitation light in ultraviolet.

TABLE 4

| x (%) | relative luminous intensity (%) |
|---|---|
| 0 | 100 |
| 1 | 268 |
| 2 | 314 |
| 3 | 402 |
| 4 | 436 |
| 5 | 442 |
| 6 | 464 |
| 7 | 426 |
| 8 | 434 |
| 9 | 450 |
| 10 | 440 |
| 50 | 356 |
| 60 | 278 |
| 80 | 186 |
| 100 | 75 |

The above is merely preferred embodiments of the present invention but not to limit the present invention. For the person skilled in the art, the present invention may have various alterations and changes. Any alterations, equivalent substitutions, improvements, within the spirit and principle of the present invention, should be covered in the protection scope of the present invention.

The invention claimed is:

1. A red phosphor comprising:
an element A, magnesium, aluminum, oxygen, and manganese in Chemical Formula (1),

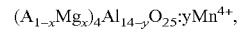

wherein the element A in the Chemical Formula (1) comprises an element selected from the group consisting of barium, calcium, combinations of barium and calcium and a combination of strontium, barium and calcium, and
wherein 0<x<1 and 0<y<1.

2. The red phosphor according to claim 1, wherein the red phosphor has an emission peak with wavelength between 635 nm and 675 nm.

3. The red phosphor according to claim 2, wherein the red phosphor has an emission peak at 652 nm.

4. A light emitting device comprising:
a light source configured to emit light; and
a red phosphor, which is configured to be excited by at least partial light to generate excited light with a higher wavelength than that of the light emitted by the light source, the red phosphor comprising:
an element A, magnesium, aluminum, oxygen, and manganese in Chemical Formula (1),

wherein the element A in the Chemical Formula (1) comprises an element selected from the group consisting of barium, calcium, combinations of barium and calcium and a combination of strontium, barium and calcium, and
wherein 0<x<1 and 0<y<1.

5. The light emitting device according to claim 4, wherein the light source provides light with a wavelength between 450 nm and 470 nm.

6. The light emitting device according to claim 4, wherein the light source provides light with a wavelength between 275 nm and 375 nm.

7. The light emitting device according to claim 4, wherein the light source is configured as an LED.

8. The light emitting device according to claim 4, wherein the red phosphor has an emission peak with a wavelength between 635 nm and 675 nm.

9. The light emitting device according to claim 8, wherein the red phosphor has an emission peak at 652 nm.

10. A method for forming a red phosphor having Chemical Formula (1)

$$(A_{1-x}Mg_x)_4Al_{14-y}O_{25}:yMn^{4+},$$

wherein element A in the Chemical Formula (1) comprises an element selected from the group consisting of strontium, barium, calcium, and combinations thereof, and wherein $0 \leq x < 1$ and $0 < y < 1$, the method comprising:

selecting a compound containing the element A, $Al_2O_3$, $MnO_2$, and $4MgCO_3 \cdot Mg(OH)_2 \cdot 4H_2O$ as raw materials;

weighing the raw materials in a molar ratio according to the Chemical Formula (1);

adding a flux to the raw materials to form a mixture; and calcining the mixture at a temperature of 1300° C.-1600° C. for 2 to 6 hours to form a calcinated product, wherein the method further comprises washing the calcinated product using water or hot water or wherein the flux includes at least one of magnesium fluoride and calcium fluoride or wherein calcining the mixture comprises increasing the temperature from 1300° C. to 1600° C. at a rate of 5° C./min-10° C./min.

11. The method according to Claim 10, further comprising:

grinding the mixture before the calcining; and
grinding the calcinated product.

* * * * *